United States Patent
Signore

(10) Patent No.: US 7,127,687 B1
(45) Date of Patent: Oct. 24, 2006

(54) METHOD AND APPARATUS FOR DETERMINING TRANSISTOR SIZES

(75) Inventor: Nicholas D. Signore, Arlington, MA (US)

(73) Assignee: SUN Microsystems, Inc., Santa Clara, CA (US)

(*) Notice: Subject to any disclaimer, the term of this patent is extended or adjusted under 35 U.S.C. 154(b) by 443 days.

(21) Appl. No.: 10/684,637

(22) Filed: Oct. 14, 2003

(51) Int. Cl.
*G06F 17/50* (2006.01)

(52) U.S. Cl. .......................................... 716/4
(58) Field of Classification Search ............ 716/4
See application file for complete search history.

(56) References Cited

U.S. PATENT DOCUMENTS 5,446,676 A * 8/1995 Huang et al. ............. 703/19
5,880,967 A * 3/1999 Jyu et al. .................. 716/6
6,629,301 B1  9/2003 Sutherland et al. ....... 716/8

FOREIGN PATENT DOCUMENTS

WO  WO 200223409 A2 * 3/2002

OTHER PUBLICATIONS

Berkelaar et al., Computing the entire active area/power consumption versus delay tradeoff curve for gate sizing with piecewise linear simulator','IEEE Transaction on Computer-Aided Design, vol. 15, pp. 1424-1414.*
Sutherland et al., Logical Effort Designing Fast CMOS Circuits, 1999.

* cited by examiner

*Primary Examiner*—Jack Chiang
*Assistant Examiner*—Brandon Bowers
(74) *Attorney, Agent, or Firm*—Park, Vaughan & Fleming, LLP

(57) ABSTRACT

A method of determining at least one ratio of transistor sizes. The method includes creating a sizing model by replacing at least one logic element in a circuit description with a sizing element that includes a piece-wise-linear current source. The method also includes determining a steady state solution to the sizing mode and determining at least one ratio of transistor sizes from the steady state solution. The method may also include determining at least one dimension of a transistor based at least in part upon the ratio of transistor sizes.

17 Claims, 7 Drawing Sheets

METHOD AND APPARATUS FOR DETERMINING TRANSISTOR SIZES

1. FIELD OF THE INVENTION

Figure 1:
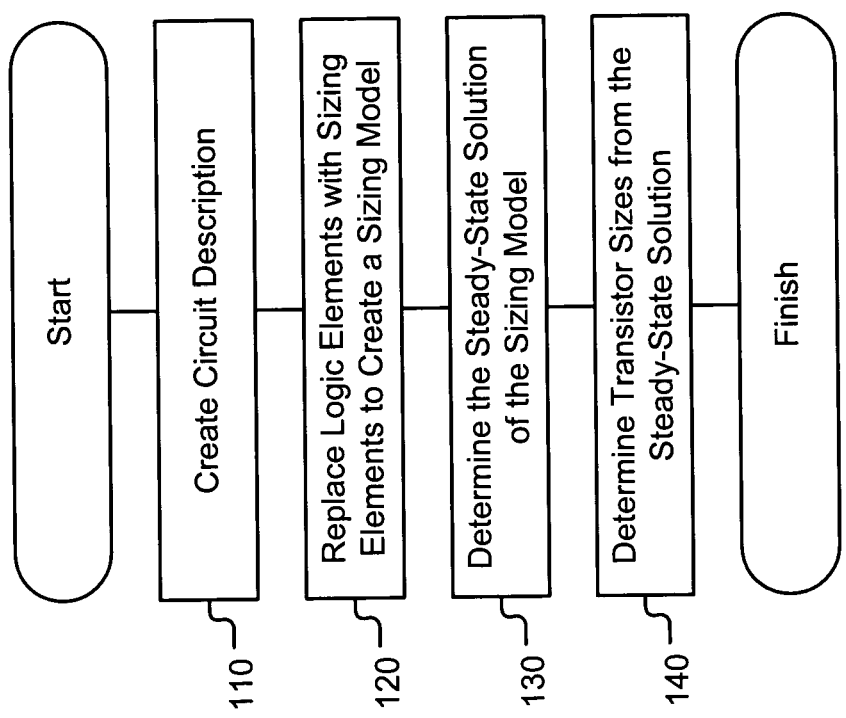

The present invention generally relates to methods of designing integrated circuits. More specifically, the present invention relates to methods of designing integrated circuits that include performing a logical effort analysis that selects near optimal transistor gate widths from a predetermined group of transistor widths.

2. BACKGROUND

Integrated circuit ("IC") design consists of a number of steps. Typically, the design starts with a specification of the functional performance characteristics of the IC. The IC is then typically broken down into more manageable blocks so that the blocks may be divided among multiple designers and analyzed in pieces by computer aided design tools. Next, logic designers write register transfer level ("RTL") descriptions of each block. Next, floor plans are created for each of the blocks. After verifying that the RTL descriptions are accurate, the designers estimate the size of each block. Then designers create a floor plan that describes the relative placement of the blocks on the IC. Finally, the designers layout the actual circuits of each block.

One of the most difficult challenges for a designer is laying out the circuit so that the circuit meets timing constraints. Without a systematic approach, designers resort to continually simulating and modifying the design to achieve the timing constraints.

One way to assist designers in meeting timing criteria is provided by a method of logical effort. The method of logical effort is a simple way to estimate delay in a complementary metal oxide semiconductor ("CMOS") circuit. The method can also be utilized to determine the proper number of logic stages on a path and the best transistor sizes for the logic gates.

According to the method of logical effort, the delay incurred by a logic gate is comprised of two components. The first component is known as "parasitic delay." The second component, known as "effort delay," is proportional to the load on the logic gate's output. The effort delay is equal to the "logical effort" multiplied by the "electrical effort." As discussed below, logical effort characterizes the properties of the logic gates and electrical effort characterizes the load.

Logical effort is a unitless parameter defined so that an inverter has a logical effort of one. The logical effort of several common gates, assuming a beta ratio (pull-up transistor width/pull-down transistor width) of 2, is shown in the following table:

| | Number of Inputs | | | | |
|---|---|---|---|---|---|
| Gate type | 1 | 2 | 3 | 4 | 5 | n |
| Inverter | 1 | | | | | |
| NAND | | 4/3 | 5/3 | 6/3 | 7/3 | (n + 2)/3 |
| NOR | | 5/3 | 7/3 | 9/3 | 11/3 | (2n + 1)/3 |
| Multiplexer | | 2 | 2 | 2 | 2 | 2 |
| XOR (parity) | | 4 | 12 | 32 | | |

In general, the logical effort of a logic element describes how much worse the logic gate is at driving an output load when compared to an inverter. Accordingly, the logical effort of a gate indicates how much more slowly the logic gate will drive a load than would an inverter.

The electrical effort can be defined as the ratio of the capacitance that loads the output of the logic gate divided by the capacitance presented by the input terminal of the logic gate.

In summary, the effort delay incurred by a logic gate can be stated as:

effort delay=(logical effort)(electrical effort)+parasitic delay

The method of logical effort analysis is described more completely in *Logical Effort: Designing Fast CMOS Circuits*, by Ivan Sutherland, Bob Sproull, and David Harris, Morgan Kaufman Publishers, Inc. (1999), ISBN # 1-55860-557-6.

3. SUMMARY OF THE INVENTION

One embodiment of the invention is a method of determining at least one ratio of transistor sizes. The method includes creating a sizing model by replacing at least one logic element in a circuit description with a sizing element that includes a piece-wise linear current source. The method also includes determining a steady state solution to the sizing mode and determining at least one ratio of transistor sizes from the steady state solution. The method may also include determining at least one dimension of a transistor based at least in part upon the ratio of transistor sizes.

4. BRIEF DESCRIPTION OF THE FIGURES

FIG. 1 presents a method of selecting logic elements from a library of logic gates.

Figure 2:
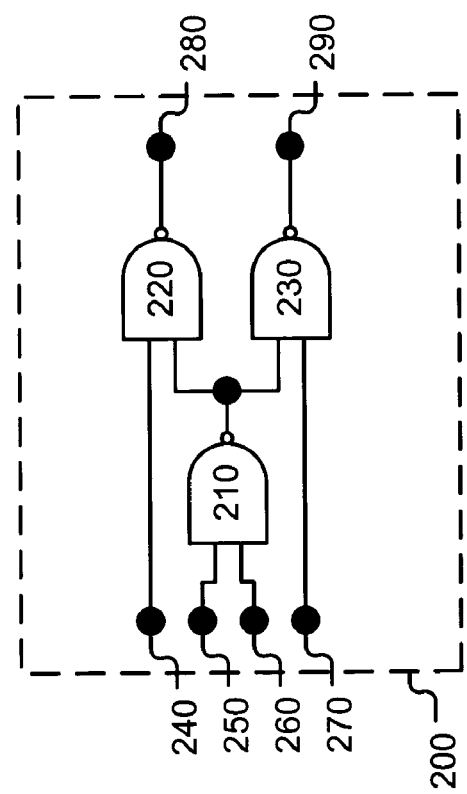

FIG. 2 presents a circuit description of a simple circuit.

Figure 3:
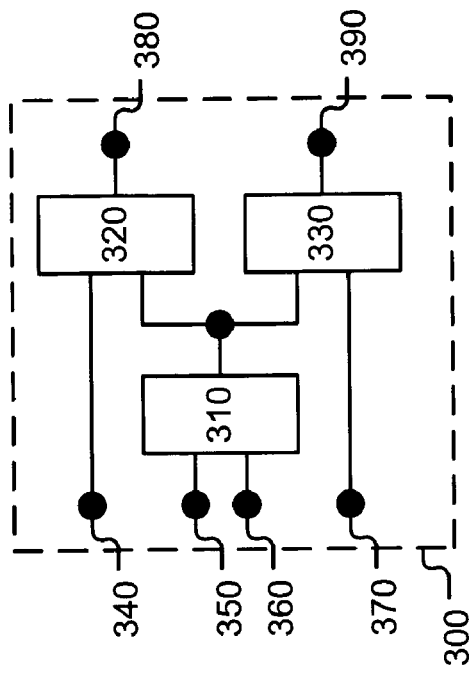

FIG. 3 presents a sizing model that corresponds to the circuit of FIG. 2.

Figure 4:
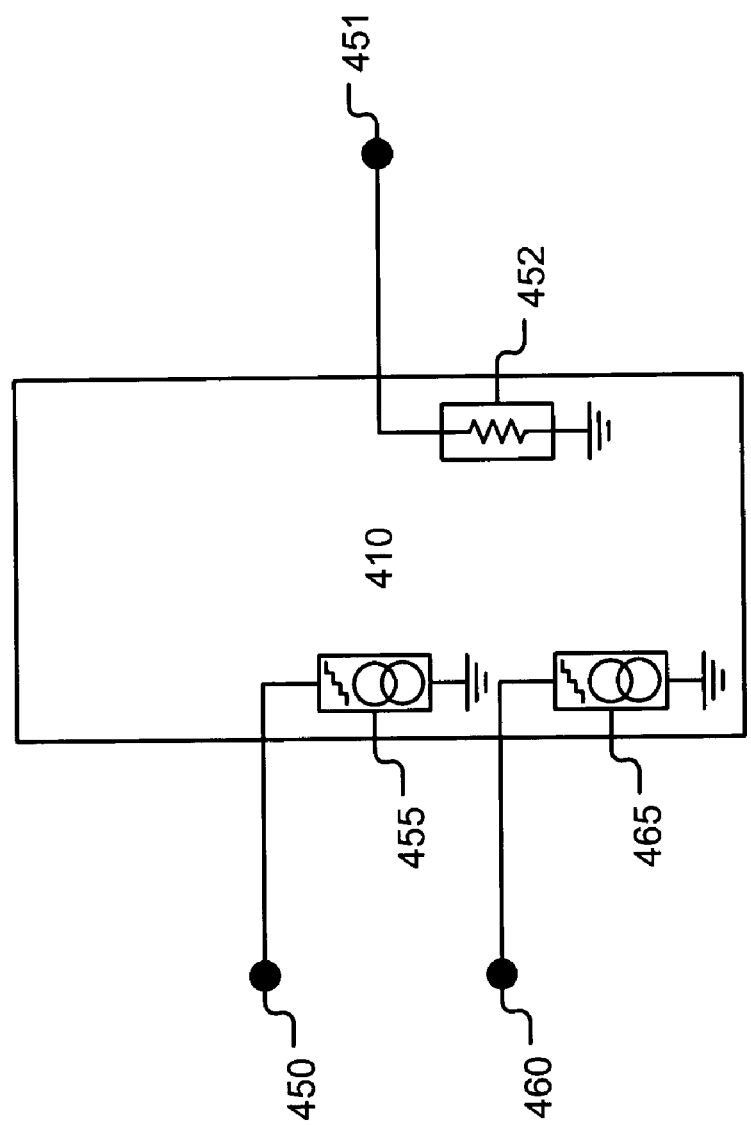

FIG. 4 presents a sizing element.

Figure 5:
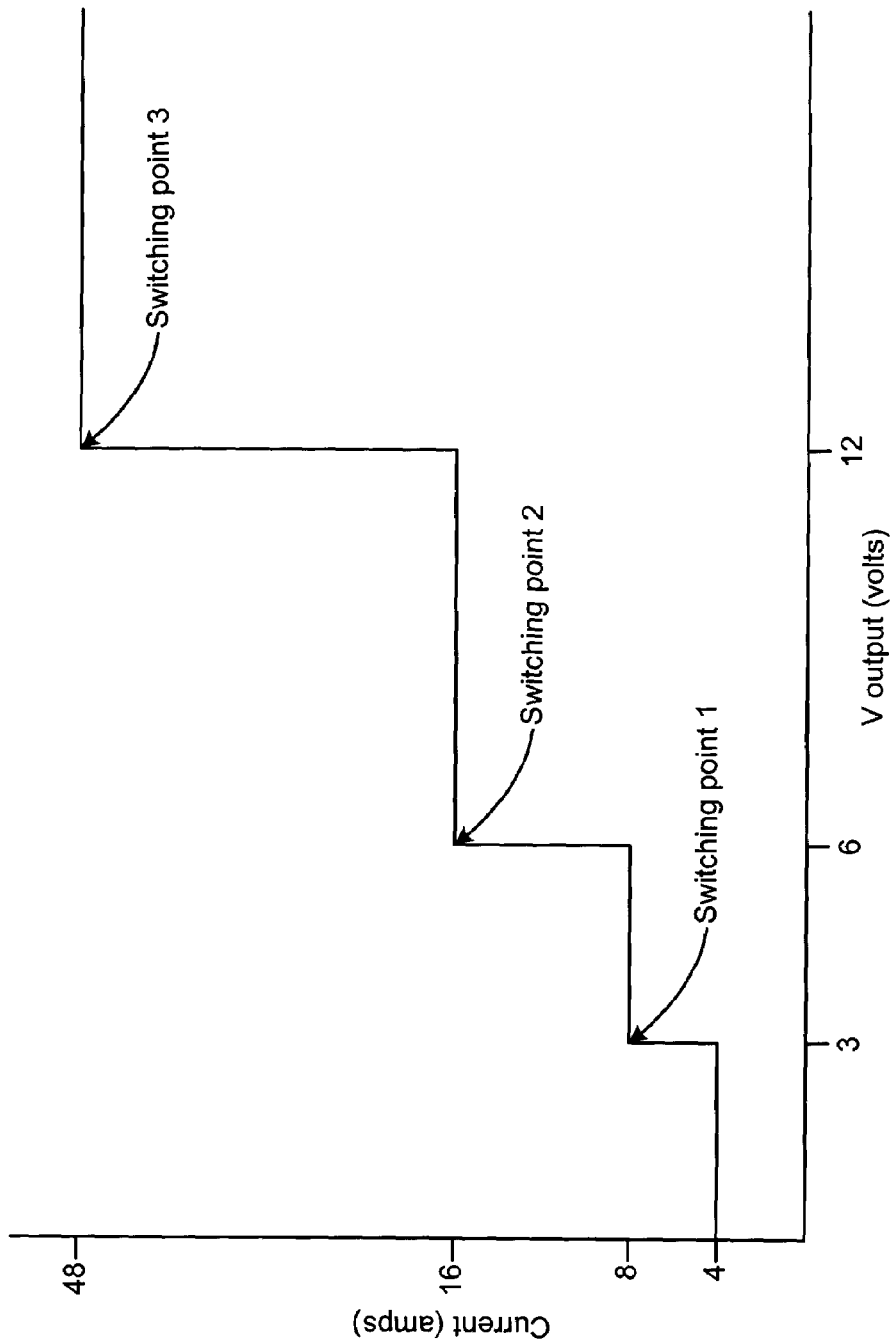

FIG. 5 presents a plot of voltage and current for a piece-wise-linear ("PWL") current source.

Figure 6:
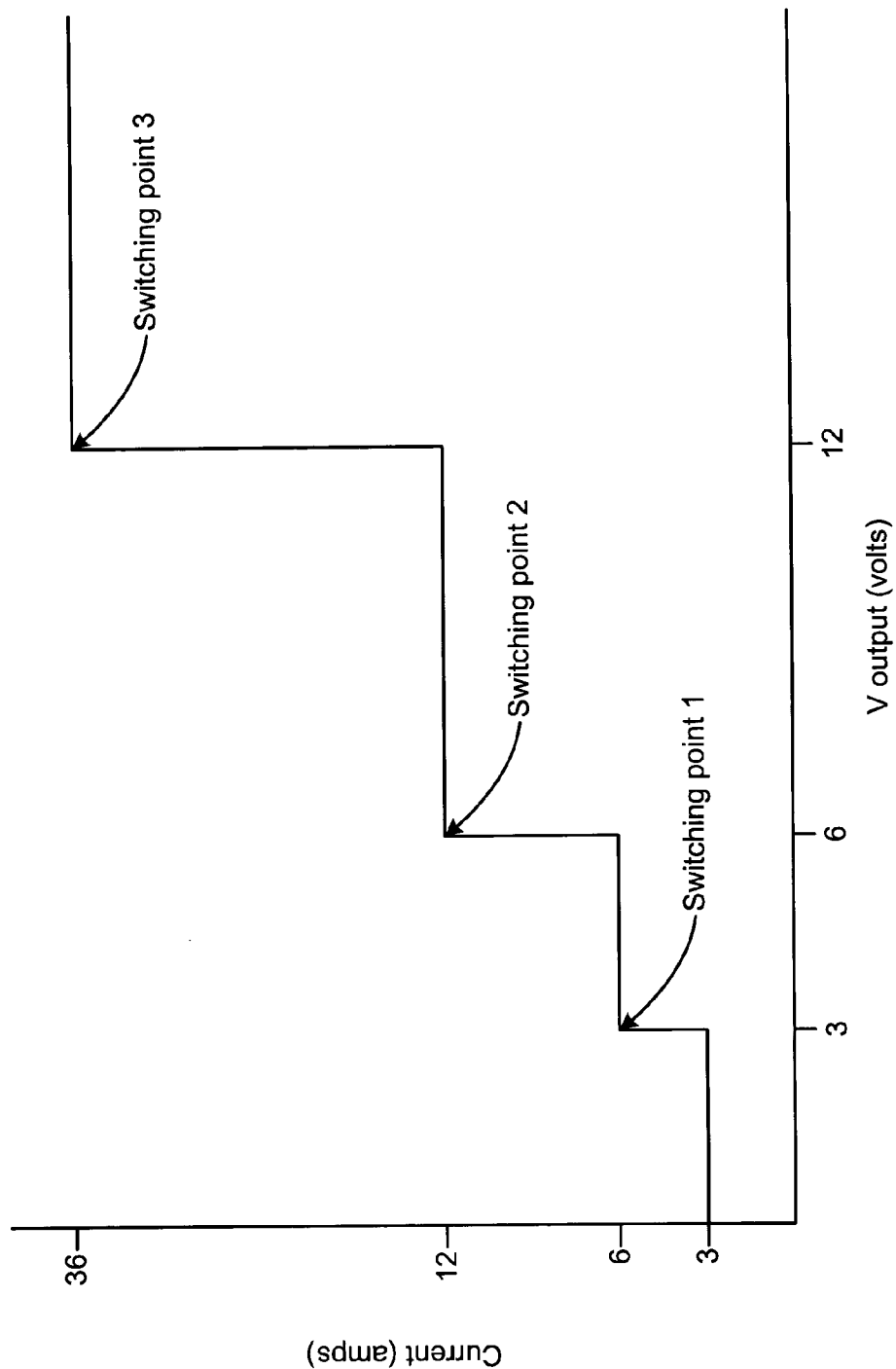

FIG. 6 presents a plot of voltage and current for another PWL current source.

Figure 7:
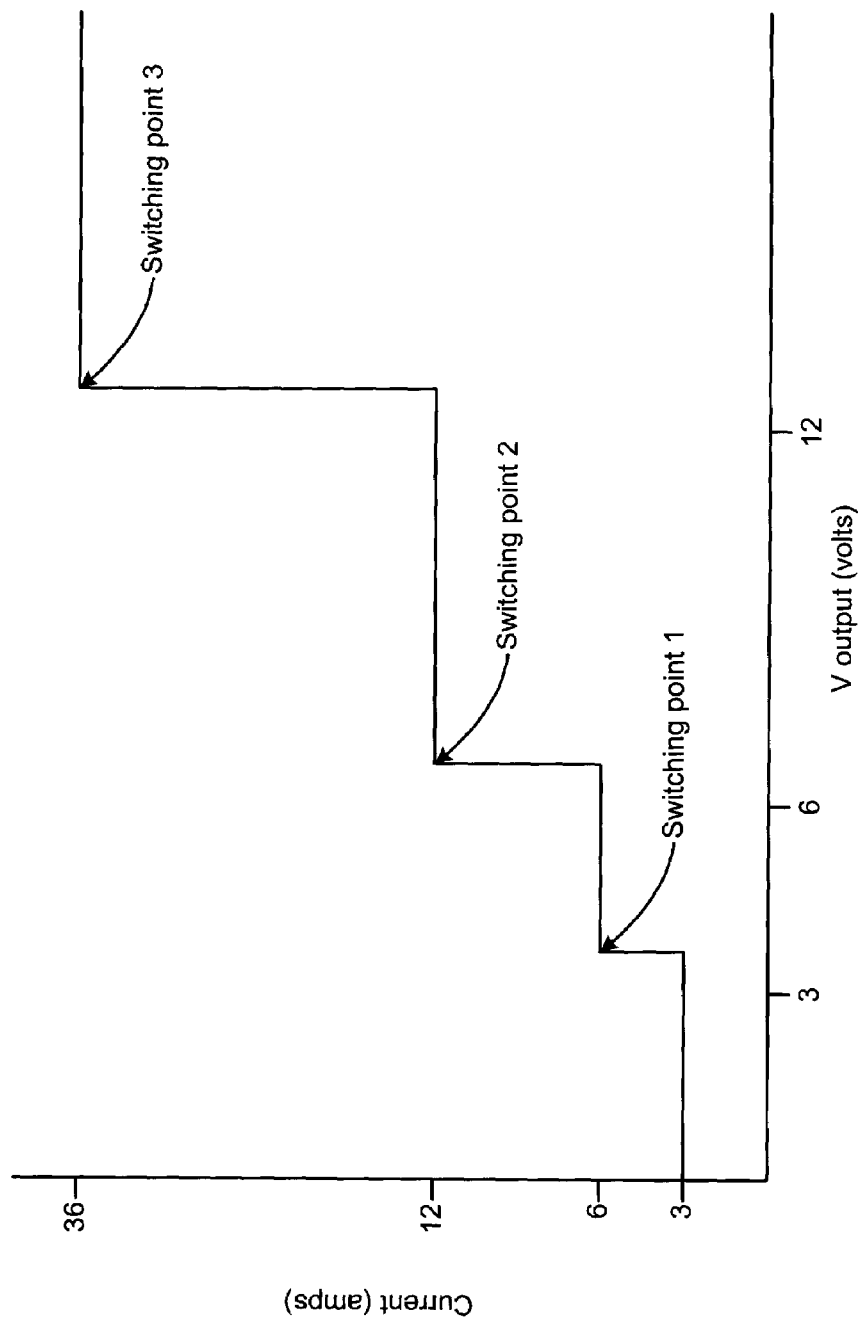

FIG. 7 presents a less conservative plot of voltage and current for a PWL current source.

Figure 8:
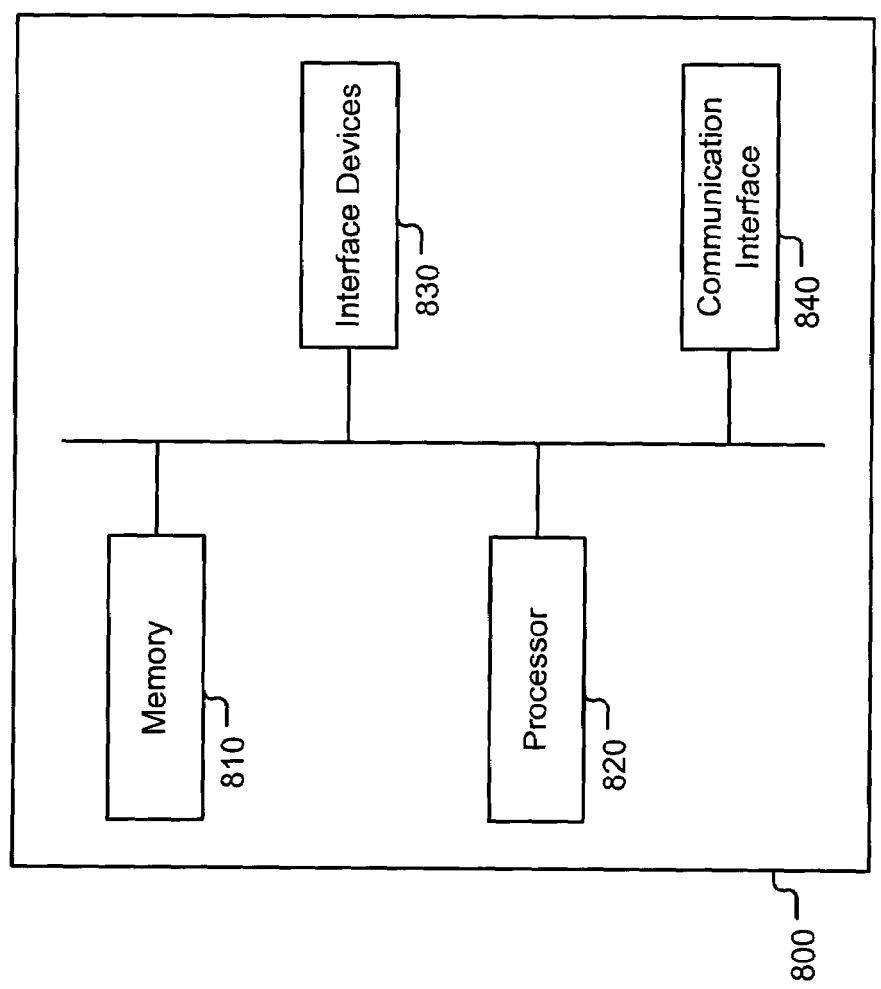

FIG. 8 presents a high-level diagram of a computer system.

5. DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

One embodiment of the invention is a method, shown in FIG. 1, that assists circuit designers in selecting logic gates from a library of logic gates.

5.1 Create a Circuit Description

The first step of the method shown in FIG. 1, which is shown in Block 110, is creating a circuit description. The circuit description details the various logic elements in a circuit design. In addition, the circuit description details how the logic elements are connected. This step is conventional.

Designers can utilize various well-known tools for creating the circuit description. For example, various schematic capture tools, such "Electric" or schematic capture tools produced by Cadence Design System, Inc., could be utilized to create a circuit description. Alternatively, various automatic circuit tools could create the circuit description based upon a number of functional requirements.

An example of a simple circuit description is shown in FIG. 2. The circuit description 200 includes three NAND gates 210, 220, and 230. The circuit description includes four inputs 240, 250, 260, and 270 and two outputs 280 and 290. The circuit description also shows that the output of NAND gate 210 is coupled to one input of NAND gate 220 and one input of NAND gate 230.

5.2 Replace Logic Elements with Sizing Elements

After the circuit description is created, as shown in Block 120 of FIG. 1, each logic element in the circuit is replaced with a sizing element. This step may be performed by an automated tool, by a circuit designer, or by a combination of the two. FIG. 3 presents a "sizing" model in which each logic element in FIG. 2 is replaced with a sizing element. Specifically, NAND gate 210 is replaced with sizing element 310. Similarly, NAND gates 220 and 230 are replaced with sizing elements 320 and 330. Sizing model 300 includes two outputs 380 and 390, which correspond to inputs 280 and 290. In addition, sizing model 300 includes four outputs 340, 350, 360, and 370 that correspond to inputs 240, 250, 260, and 270.

FIG. 4 presents a more detailed drawing of sizing element 410, which corresponds to sizing element 310. As shown in FIG. 4, sizing element 410 includes a sink terminal 451. This sink terminal 451 is coupled to a sink element 452, which is also coupled to ground. As shown in FIG. 4, the sink element 452 contains a resistor. In some embodiments of the invention, the size of the resistor is equal to the inverse of the fanout ratio of logic gate 210.

Sizing element 410 also contains a first source terminal 450. The first source terminal 450 is coupled to a first piece-wise-linear ("PWL") current source 455, which is also coupled to ground. The first PWL current source 455 will deliver a DC current at the first source terminal 450.

The first PWL current source 455 can be configured to output a particular current value based upon the voltage present on sink terminal 451. For example, as shown in FIG. 5, if sink terminal 451 were at a voltage less than or equal to 3 volts, then the first PWL current source 455 would output 4 amps. If sink terminal 451 were at a voltage slightly greater than 3 volts, then the first PWL current source 455 would output 8 amps. Similarly, if sink terminal 451 were at a voltage slightly greater than 6 volts, then the first PWL current source 455 would output 16 amps. If the sink terminal 451 were at a voltage greater than 12 volts, then the first PWL current source 455 would output 48 amps.

In some embodiments of the invention, the current values output by the first PWL current source 455 directly correspond to the input capacitance (and hence transistor size) of logic gates in a library. For example, the current values may be proportional to the input capacitance of logic gates in a library. Thus, referring to FIG. 5, the 4 amp current may correspond to the input capacitance of a first NAND gate; the 8 amp current may correspond to the input capacitance of a second NAND gate; the 16 amp current may correspond to the input capacitance of a third NAND gate; and the 48 amp current may correspond to the input capacitance of a fourth NAND gate. Other embodiments of the invention may utilize discrete currents for a larger number of logic gates, such as 5, 6, 7, 8, 9, 10, or more. Similarly, still other embodiments of the invention may utilize only two or three discrete currents for selection among a smaller number of logic gates. The first PWL current source 455 can easily be simulated utilizing the PWL function present in various circuit simulators, such as SPICE.

By configuring the first PWL current source 455 so that it can output one of four discrete currents, one of four different NAND gates can be automatically selected based upon the voltage present on sink terminal 451. Thus, it can be seen that FIG. 5 is a transfer function between ideal gates and actual gates that are present in a particular library.

Sizing element 410 also contains a second source terminal 460. The second source terminal is coupled to a second PWL current source 465, which is also coupled to ground. In some embodiments of the invention, the second PWL current source 465 is configured identically to the first PWL current source 455. However, in other embodiments of the invention, the PWL current sources 455 and 465 are configured differently.

5.3 Determine the Steady-State Solution to the Sizing Model

Next, as shown in block 130 of FIG. 1, the steady-state solution of sizing model 300 is determined. Sizing model 300 includes only PWL current sources and resistors. In order to avoid a trivial zero-voltage and zero-current solution, voltages need to be applied to sinks 380 and 390 of summing elements 320 and 330. These voltages may represent the capacitance of a fixed load. After the voltages are so applied, the voltages and currents on the various nodes of the sizing model can be easily determined. For example, such voltages and currents can be rapidly determined by hand calculations or by circuit analysis programs, such as SPICE.

5.4 Determine Transistor Size from the Steady-State Solution

Next, as shown in block 140 of FIG. 1, the transistor sizes of the logic gates in FIG. 2 can be determined. The resulting voltages and currents on various nodes of the sizing model can be utilized to determine the appropriate sizes of the transistors within logic gates 210, 220, and 230. For example, the actual transistor gate width of NAND gate 210 can be determined by multiplying the value of the voltage appearing across the resistor in sizing element 310 by the width of a reference transistor utilized in a reference logic gate. In some embodiments of the invention, the reference transistor width is the width of an n-type transistor gate of an inverter with a fixed beta ratio.

5.5 Other Embodiments of the Invention

While the methods described above utilize only NAND gates, any type of logic gates could be similarly sized using the methods discussed above. For example, FIG. 6 presents a transfer function that can be utilized to automatically select one of four inverters. This transfer function is similar to the transfer function of FIG. 5 except that the y-axis values have been reduced by ¾, i.e., the ratio of the logical efforts of an inverter (1) and a NAND gate (4/3).

The transfer function shown in FIG. 6 is conservative. For example, if an inverter with an input capacitance 3.01 is needed, then an inverter with an input capacitance of 6 is automatically selected. Other embodiments of the invention utilize less conservative transfer functions. One such transfer function, which can be utilized to automatically select one of four inverters, is shown in FIG. 7. Note that the three "switch points" of FIG. 7 occur at higher voltage levels than the switch points of FIG. 6. In still other embodiments of the invention, some but not all switch points may occur at higher voltage levels than shown in FIG. 6.

Another embodiment of the invention is a device, such as a hard disk drive, a CD ROM, a DVD ROM, a floppy disk, a flash disk, or a tape, containing machine readable instructions, that when executed, performs portions of one or more of the above described methods.

Still another embodiment of the invention is a computer system programmed to perform portions of one or more of the above described methods. Such a computer system is shown in FIG. 8. In some embodiments of the invention, computer system 800 would include memory 810, one or more processors 820, and interface devices 830, such as keyboards, mice and trackballs. In addition, the computer system could include a communication interface 840, such as an Ethernet network interface that allows the computer system 800 to communicate with other computers.

Yet another embodiment of the invention is an integrated circuit that is designed utilizing portions of one or more of the above methods.

5.6 Conclusion

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

The invention claimed is:

1. A method of determining at least one ratio of transistor sizes, the method comprising:
   a) creating a sizing model by replacing at least one logic element in a circuit description with a sizing element that includes a piece-wise-linear current source, wherein the act of creating a sizing model includes creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage;
   b) determining a steady state solution to the sizing model; and
   c) determining at least one ratio of transistor sizes from the steady state solution.

2. The method of claim 1, further comprising:
   d) determining at least one dimension of a transistor based at least in part upon the ratio of transistor sizes.

3. The method of claim 1, wherein the act of creating a sizing model includes creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the second current being greater than the first current, and the second voltage being greater than the first voltage.

4. The method of claim 1, wherein the act of creating a sizing model includes creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current corresponding to the input capacitance of a first logic element, the second current corresponding to the input capacitance of a second logic element.

5. The method of claim 1, wherein the act of creating a sizing model includes creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current being proportional to the input capacitance of a first logic element, the second current being proportional to the input capacitance of a second logic element.

6. The method of claim 1, wherein the act of creating a sizing model includes creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current corresponding to the input capacitance of a first logic element, the second current corresponding to the input capacitance a second logic element, both the first logic element and the second logic element being of the same type and selected from the group of types: inverter, AND, NAND, OR, NOR, XOR, and multiplexer.

7. The method of claim 1, wherein the act of creating a sizing model includes creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current being proportional to the input capacitance of a first logic element, the second current being proportional to the input capacitance of a second logic element, both the first logic element and the second logic element being of the same type and selected from the group of types: inverter, AND, NAND, OR, NOR, XOR, and multiplexer.

8. A device containing machine readable instructions, that when executed perform a method of determining at least one ratio of transistor sizes, the method comprising:
   a) creating a sizing model by replacing at least one logic element in a circuit description with a sizing element that includes a piece-wise-linear current source, wherein creating a sizing model includes a piece-wise-linear current source configured to (1) select a first current if the voltage at the piece-wise-linear current source is less than or equal to a first voltage and (2) select a second current if the voltage at the piece-wise-linear current source is greater than the first voltage and less than or equal to a second voltage;
   b) determining a steady state solution to the sizing model; and
   c) determining at least one ratio of transistor sizes from the steady state solution.

9. The device of claim 8, further containing computer readable instructions for:

d) determining at least one dimension of a transistor based at least in part upon the ratio of transistor sizes.

10. The device of claim 8, further containing computer readable instructions for creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the second current being greater than the first current, and the second voltage being greater than the first voltage.

11. The device of claim 8, further containing computer readable instructions for creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current corresponding to the input capacitance of a first logic element, the second current corresponding to the input capacitance of a second logic element.

12. The device of claim 8, further containing computer readable instructions for creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current being proportional to the input capacitance of a first logic element, the second current being proportional to the input capacitance of a second logic element.

13. The device of claim 9, further containing computer readable instructions for creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current corresponding to the input capacitance of a first logic element, the second current corresponding to the input capacitance of a second logic element, both the first logic element and the second logic element being of the same type and selected from the group of types: inverter, AND, NAND, OR, NOR, XOR, and multiplexer.

14. The device of claim 8, further containing computer readable instructions for creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the first current being proportional to the input capacitance of a first logic element, the second current being proportional to the input capacitance of a second logic element, both the first logic element and the second logic element being of the same type and selected from the group of types: inverter, AND, NAND, OR, NOR, XOR, and multiplexer.

15. An integrated circuit created at least in part by a method of determining at least one ratio of transistor sizes, the method comprising:
   a) creating a sizing model by replacing at least one logic element in a circuit description with a sizing element that includes a piece-wise-linear current source, wherein the sizing model includes a piece-wise-linear current source configured to (1) select a first current if the voltage at the piece-wise-linear current source is less than or equal to a first voltage and (2) select a second current if the voltage at the piece-wise-linear current source is greater than the first voltage and less than or equal to a second voltage;
   b) determining a steady state solution to the sizing model; and
   c) determining at least one ratio of transistor sizes from the steady state solution.

16. The integrated circuit of claim 15, wherein the integrated circuit was created at least in part by determining at least one dimension of a transistor based at least in part upon the ratio of transistor sizes.

17. The integrated circuit of claim 15, wherein the integrated circuit was created at least in part by creating a sizing model that includes a piece-wise-linear current source configured to (1) select a first current if the voltage at the piece-wise-linear current source is less than or equal to a first voltage, and (2) select a second current if the voltage at the piece-wise-linear current source is greater than the first voltage and less than or equal to a second voltage, the second current being greater than the first current, and the second voltage being greater than the first voltage.

* * * * *